United States Patent
Lee et al.

(10) Patent No.: US 7,703,997 B2
(45) Date of Patent: Apr. 27, 2010

(54) IMAGE SENSOR MODULE HAVING PRECISE IMAGE-PROJECTION CONTROL

(75) Inventors: Hsiao-Wen Lee, Hsinchu (TW); Tzu-Han Lin, Hsinchu (TW); Pai-Chun Peter Zung, Hsinchu (TW); Chien-Pang Lin, Hsinchu County (TW)

(73) Assignee: Visera Technologies, Co., Ltd., Hsin-Chu (TW)

( * ) Notice: Subject to any disclaimer, the term of this patent is extended or adjusted under 35 U.S.C. 154(b) by 460 days.

(21) Appl. No.: 11/653,297

(22) Filed: Jan. 16, 2007

(65) Prior Publication Data

US 2007/0166029 A1    Jul. 19, 2007

(30) Foreign Application Priority Data

Jan. 18, 2006    (TW) ............................... 95101927 A

(51) Int. Cl.
G03B 17/00    (2006.01)
H04N 5/335    (2006.01)
H04N 5/225    (2006.01)
G02B 7/02     (2006.01)

(52) U.S. Cl. .................. 396/529; 348/294; 348/340; 359/819

(58) Field of Classification Search ................ 396/133, 396/529, 533; 348/272, 294, 298, 308, 340; 359/642, 808, 811, 819, 829; 250/339.02, 250/370.08, 559.07, 559.08

See application file for complete search history.

(56) References Cited

U.S. PATENT DOCUMENTS

| | | | |
|---|---|---|---|
| 6,893,941 B2 * | 5/2005 | Suda | 438/455 |
| 2003/0057359 A1 | 3/2003 | Webster | |
| 2004/0008417 A1 * | 1/2004 | Shimizu et al. | 359/619 |
| 2006/0044450 A1 * | 3/2006 | Wolterink et al. | 348/340 |

FOREIGN PATENT DOCUMENTS

| | | |
|---|---|---|
| CN | 1682377 A | 10/2005 |
| CN | 1714131 A | 12/2005 |
| JP | 2002014205 | 1/2002 |
| JP | 2005539276 | 12/2005 |
| WO | WO 2004/027880 A2 | 4/2004 |

* cited by examiner

*Primary Examiner*—Rochelle-Ann J Blackman
(74) *Attorney, Agent, or Firm*—Browdy and Neimark, PLLC

(57) ABSTRACT

An image sensor module comprises an image sensor chip, at least one lens layer, and at least one bonding layer. The image sensor chip has an image capturing zone manufactured with an image capturing element, and a partition zone surrounding the image capturing zone. The at least one lens layer is stacked on the image sensor chip, having a transparent substrate and a lens mounted on the transparent substrate and adapted to focus the projected image onto the image capturing zone of the image sensor chip. The at least one bonding layer is arranged corresponding to the partition zone of the image sensor chip and bonded between the image sensor chip and the at least one lens layer, mixing of a glue agent and a plurality of spacer elements with which the height of each the spacer elements is determined to be the height of the bonding layer.

26 Claims, 5 Drawing Sheets

IMAGE SENSOR MODULE HAVING PRECISE IMAGE-PROJECTION CONTROL

BACKGROUND OF THE INVENTION

1. Field of the Invention

The present invention relates to image sensor modules and more particularly, to an image sensor module having precise image-projection control.

2. Description of the Related Art

An image sensor module applicable to a camera device used in a cell phone, PDA, or any of a variety of portable electronic products is generally comprised of an image sensor chip, which is made through an image-sensor technology of the semiconductor manufacturing, and an optical lens assembly. When the optical lens assembly projects an object onto the image sensor chip, the circuit operation of the image sensor chip accurately picks up the projected image and passes the image signal of the object to the aforementioned portable electronic product. The quality of the image projection of the optical lens assembly determines the quality of the image signal processed by the image sensor chip. If the optical lens assembly manufactured by a module engineering of stacking and joining lenses together cannot focus a projected image onto the image sensor chip precisely, an out-of-focus problem will occur, thereby degrading the image quality.

FIG. 1 is an exploded view of a focus adjustable type image sensor module according to the prior art. According to this design, the image sensor module 1 comprises a screw body 10, a sensor chip 11, and a lens assembly 12. The image sensor chip 11 is fixedly mounted inside the body 10, having an image pick-up element 110 on the position aligned with the direction of a main optical axis. The body 10 has a transparent substrate 101 and a threaded inside wall 102. The transparent substrate 101 and the threaded inside wall 102 define an accommodation chamber for accommodating the lens assembly 12. The lens assembly 12 has an optical lens 120, and a threaded outside wall 121 threaded into the threaded inside wall 102 of the body 10. By means of adjusting the depth of the lens assembly 12 inside the accommodation chamber with rotating along the threading path of the threaded inside wall 102 of the body 10, optical aberrations caused by the lens 120 module engineering of the formation of the lens assembly 12 are controlled, so that the lens 120 accurately focuses the image onto the image pick-up element 110. However, the friction force that is produced during rotation of the lens assembly 12 may cause fine particles to fall from the interface between the threaded inside wall 102 of the body 10 and the threaded outside wall 121 of the lens assembly 12 to the transparent plate 101. As a result, impurities may block the optical path to lower the quality of the image projection of an object. Further, the threaded inside wall 102 of the body 10 must have a certain height so that the lens assembly 12 can be adjusted vertically therein. Thus, the image sensor module 1 cannot fit the requirement for a small-sized portable electronic product.

FIG. 2 shows a stacking type of image sensor module made by semiconductor wafer manufacturing according to the prior art. According to this design, the image sensor module 2 comprises a silicon wafer 21, a first spacer plate 22, a first cover plate 23, a first lens module 24, a second spacer plate 25, a second lens module 26, a third spacer plate 27, and a second cover plate 28, which are stacked in sequence. The spacer plates 22, 25 and 27 are made of transparent glass with grinding and polishing to a predetermined thickness, and respectively provided with openings for passing image forming light rays from the lens modules 24 and 26, to the silicon wafer 21. The stacked structure of the image sensor module 2 is than cut into multiple image sensor elements 20. As shown in FIG. 3, each image sensor elements 20 comprises an image sensor chip 210, a first spacer 220, a first cover 230, a first lens 240, a second spacer 250, a second lens 260, a third spacer 270, and a second cover 280. Also a sticky resin material is provided then hard-baked between each two adjacent layers of the image sensor module 2 thus forming multiple adhesive layers 200 of the image sensor element 20. Therefore, the optical distance of the image forming light rays from the lenses 240 and 260 to the projected image on the image sensor chip 210 is controlled by the thickness of the spacers 220 and 250 and the adhesive layers 200. Practically, there is about 5% error in the grinding process of forming the spacers 220, 250 and 270, and more than 20% error in the film thickness control of the resin material for the adhesive layers 200. Under the factor of multi-layer manufacturing errors, it is difficult to accurately focus the projected image by the lenses 240 and 260 onto the image sensor chip 210, thereby degrading the image forming quality of the image sensor element 20.

SUMMARY OF THE INVENTION

The present invention has been accomplished under the circumstances in view. It is therefore the main object of the present invention to provide an image sensor module having precise image-projection control, which uses a wafer level structure to effectively control the lens module dimensions suitable for use in small-sized portable electronic product.

It is another object of the present invention to provide an image sensor module having precise image-projection control, which effectively eliminates optical error caused by module engineering, thereby obtaining optimal image quality.

To achieve these and other objects of the present invention, the image sensor module comprises an image sensor chip, at least one lens layer, and at least one bonding layer. The image sensor chip has an image capturing zone manufactured with an image capturing element, and a partition zone surrounding the image capturing zone. The at least one lens layer is stacked on the image sensor chip, having a transparent substrate and a lens mounted on the transparent substrate and adapted to focus the projected image onto the image capturing zone of the image sensor chip. The at least one bonding layer is arranged corresponding to the partition zone of the image sensor chip, mixing of a glue agent and a plurality of spacer elements. The height of the spacer elements is determined to be the height of the bonding layer. The at least one bonding layer is bonded between the image sensor chip and the at least one lens layer.

DETAILED DESCRIPTION OF THE INVENTION

Figure 1:
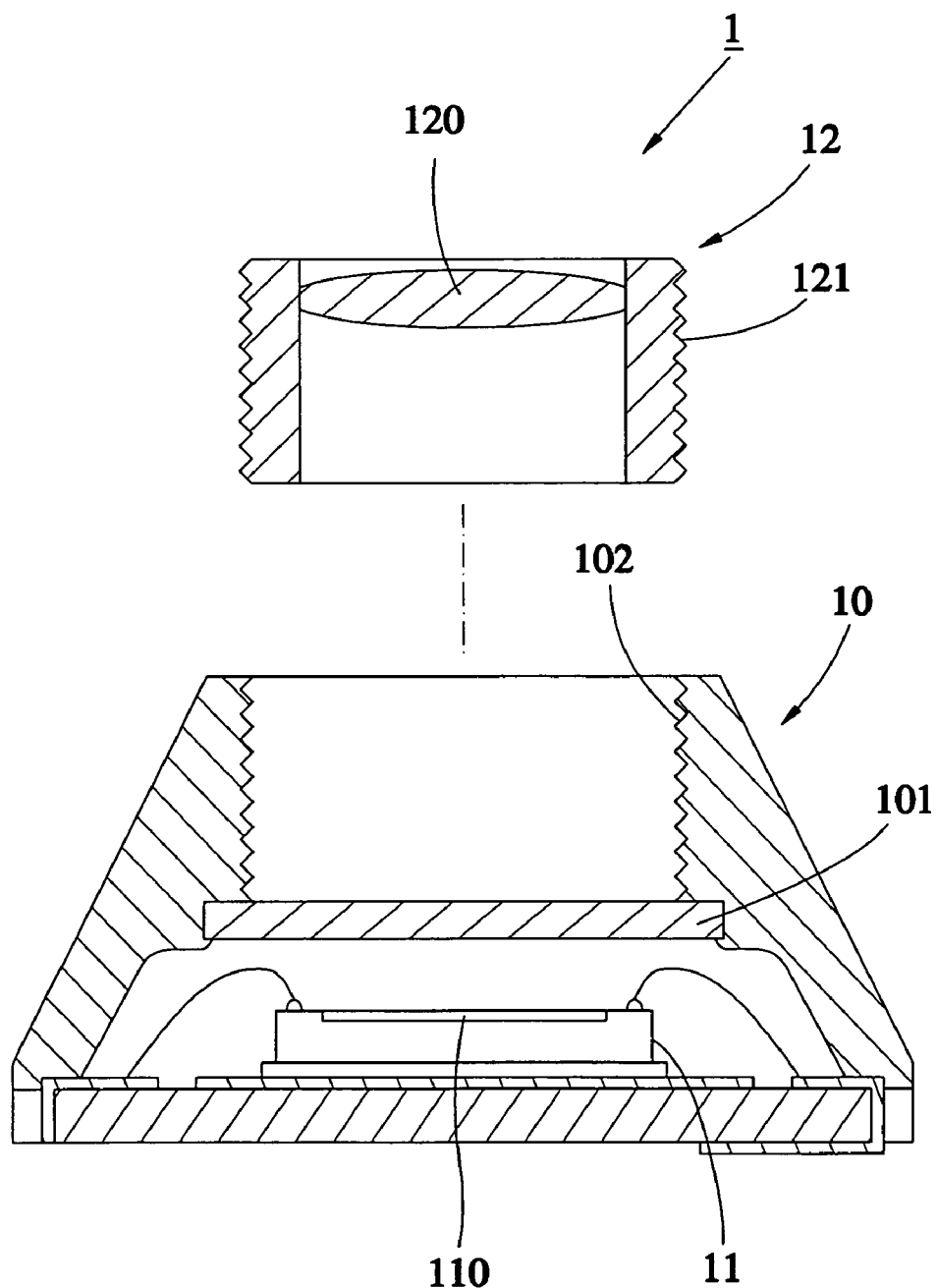
FIG. 1 is an exploded view of a screw joint focus adjustment type image sensor module according to the prior art.
Figure 2:
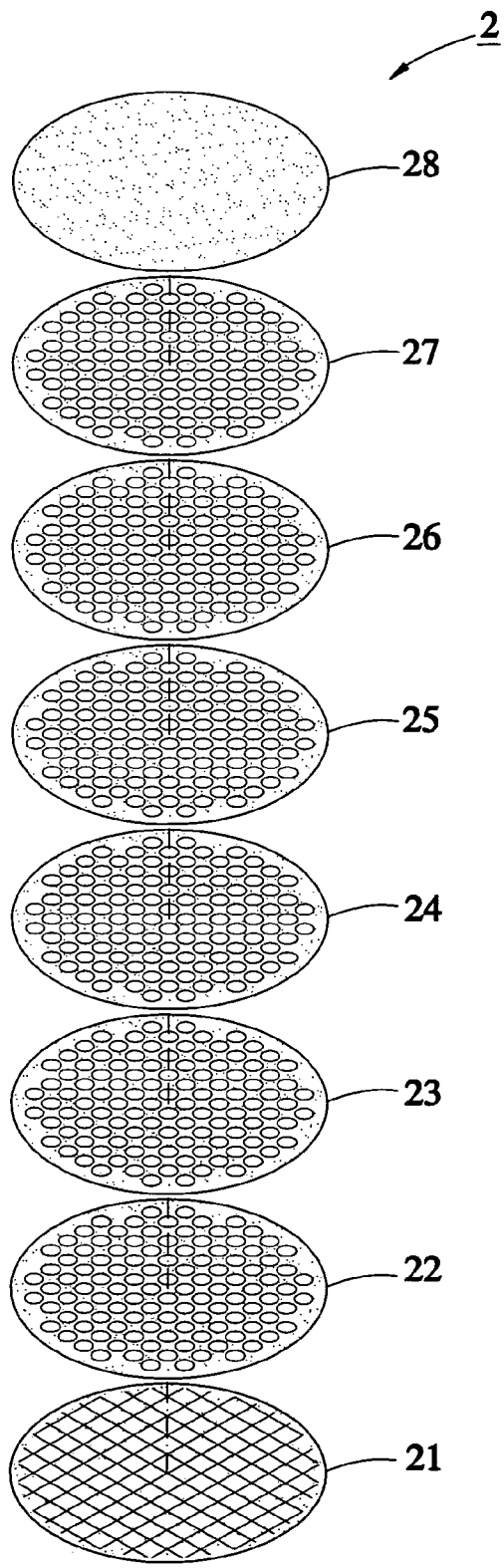
FIG. 2 is an exploded view of a stacked design of image sensor module structure made by semiconductor wafer manufacturing technology according to the prior art.
Figure 3:
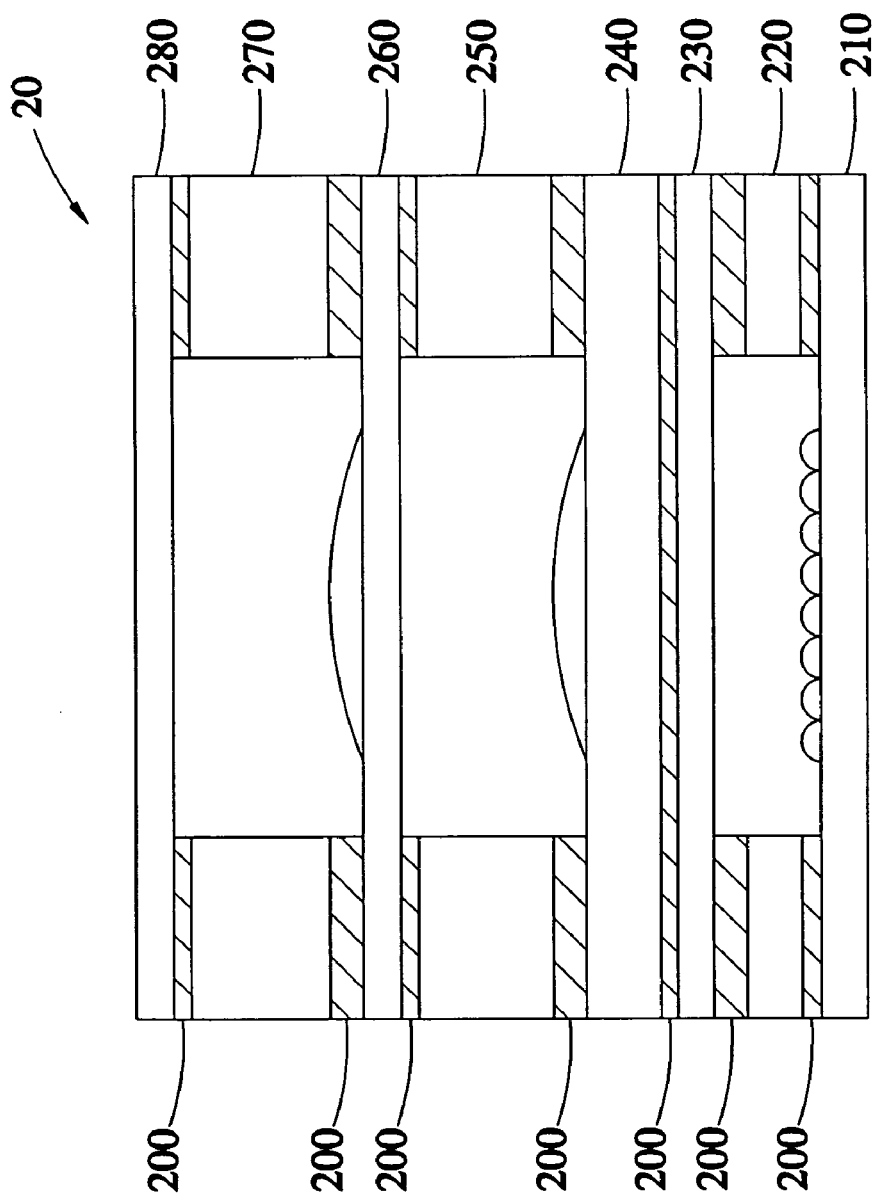
FIG. 3 is a schematic sectional view of one module element cut from the stacked design of image sensor module structure made shown in FIG. 2.
Figure 4:
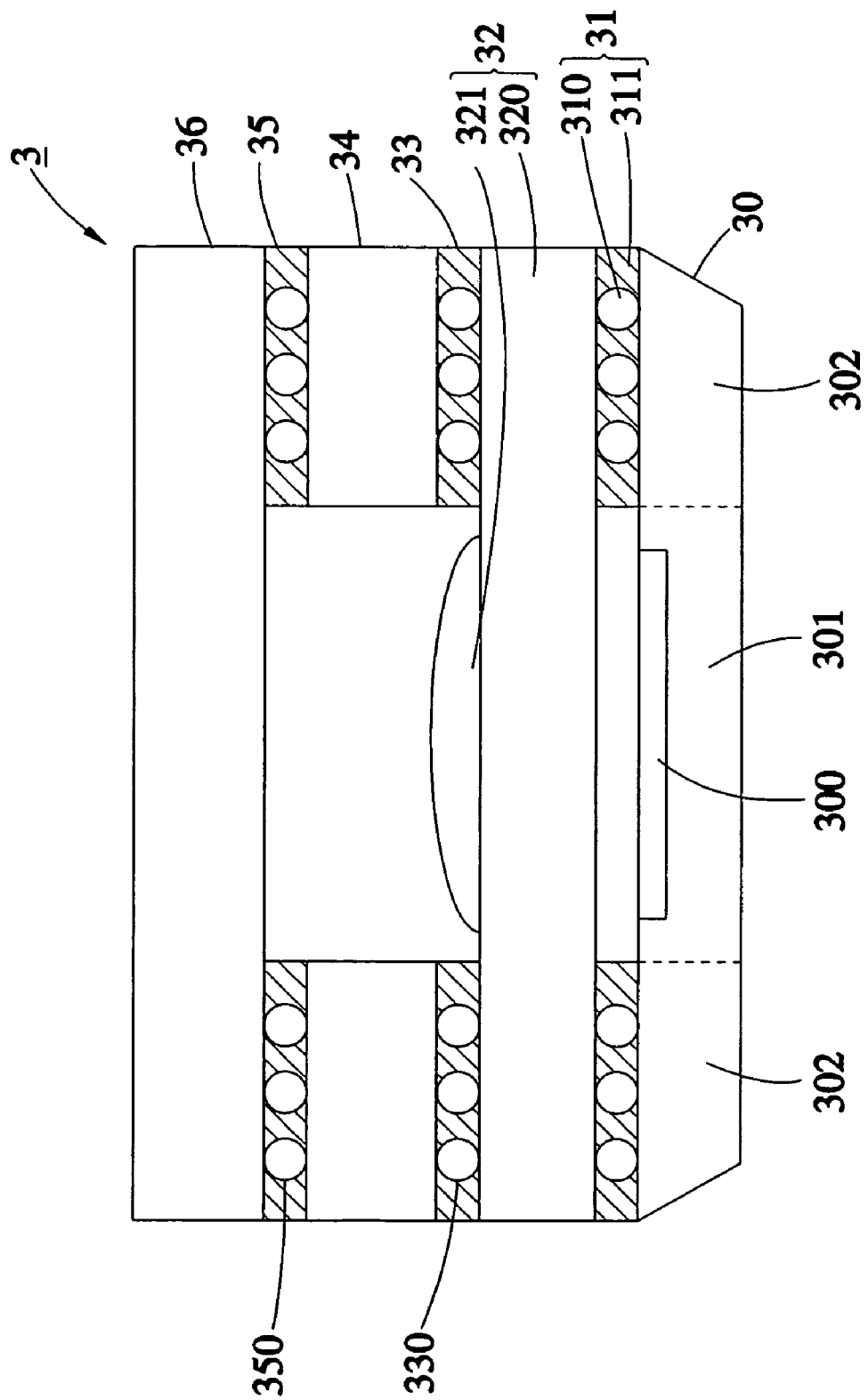
FIG. 4 is a schematic sectional view of an image sensor module in accordance with a first embodiment of the present invention.

Referring to FIG. 4, an image sensor module 3 in accordance with a first embodiment of the present invention is a device element of a stacked structure cut from a wafer level module, comprising an image sensor chip 30, a lens layer 32, a spacer layer 34 and a cover layer 36 that are stacked on one another in proper order, and bonding layers 31, 33 and 35 that are respectively bonded between each two adjacent layers of the stacked structure of the image sensor chip 30, lens 32, spacer layer 34 and cover layer 36.

The image sensor chip 30 is a CIS technology manufactured integrated chip, i.e., CMOS (Complementary Metal Oxide Semiconductor) image sensor chip, defining an image capturing zone 301 and a partition zone 302. The image capturing zone 301 is surrounded by the partition zone 302 and having an image capturing element 300 manufactured thereon.

The lens layer 32 comprises a transparent substrate 320 and a lens 321 mounted on the transparent base 320. The transparent substrate 320 is pervious to light to maintain the image forming quality. The lens 321 is adapted to focus the image on the image capturing element 300.

The spacer layer 34 is set corresponding to the partition zone 302 of the image sensor chip 30. Same as the prior art designs, the spacer layer 34 is made of a glass material with grinding and polishing subject to the desired thickness.

The cover layer 36 is on the top of the image sensor module 3. It is a transparent member that pervious to light, and protects the lens layer 32 against environmental pollution to maintain the quality of the image sensor module 3.

The bonding layers 31, 33 and 35 are arranged corresponding to the partition zone 302 of the image sensor chip 30 for bonding each two adjacent layers mentioned right above respectively, i.e., the image sensor chip 30, the lens layer 32, the spacer layer 34, and the cover layer 36 in sequence. The first bonding layer 31 is formed of a glue agent 311 and a plurality of spacer elements 310 for adhering the lens layer 32 to the image sensor chip 30. Preferably, the spacer elements 310 are spherical glass beads made of hot melt silicon dioxide with the manufacturing error of the bead diameter being controlled within about 1%; and the volume density of mixing the spacer elements 310 and the glue agent 311 is at the respective ratio of about 1:50. The second bonding layer 33 and the third bonding layer 35 have the same material composition as the first bonding layer 31, each having multiple spacer elements 330 or 350 that have a respective specific size and arranged subject to a respective specific mixing density. The second bonding layer 33 is bonded between the lens layer 32 and the spacer layer 34. The third bonding layer 35 is bonded between the spacer layer 34 and the cover layer 36.

During the assembly process of the image sensor module 3, the first bonding layer 31 is sandwiched between the image sensor chip 30 and the lens layer 32. Because the spacer elements 310 simply occupy a small part of the space in the first bonding layer 31, adjacent spacer elements 310 are squeezed against one another and moving to an equivalent plane with the same potential energy when the first bonding layer 31 pressed by the image sensor chip 30 and the lens layer 32 from two reversed directions, and the glue agent 311 flows to the gap among the spacer elements 310. Thus, the contact interface of each of the spacer elements 310 with the image sensor chip 30 and lens layer 32 is respective a point-to-point contact, and the glue agent 311 is for joining the image sensor chip 30 and the lens layer 32. After bonding, the height of the first bonding layer 31 is equal to the thickness of the spacer element 310. Therefore, when the lens 321 has determined an optical path of where an image projected, the most suitable size of spacer elements 310 can then be selected to determine the thickness of the first bonding layer 31 and to enable the lens layer 32 to accurately focus the projected image onto the image capturing element 300. In the same manner, the spacer elements 330 or 350 of the second bonding layer 33 or the third bonding layer 35 are used to control the combination thickness between the lens layer 32 and the spacer layer 34 or the combination thickness between the spacer layer 34 and the cover layer 36. Despite the final thickness of the spacer layer 34 after mechanical engineering, the bonding layers 33 and 35 can use the accurate size of spacer elements 330 and 350 to compensate for manufacturing aberrations. It is unnecessary to accurately control the density of the spacer elements in every bonding layer, only be sure that the respective spacer elements are evenly distributed on an equivalent plane with the same potential energy and dense enough to bear stress from the neighbor top and bottom layers without crash. Experimentally, the mixing density between 1% and 10% shows the same effect. Further, the material for the spacer elements can be selected from $SiO_2$, SiC, or polystyrene. Micropearl SI—H or glass-fiber developed by Sekisui Chemical Co., Ltd. Japan of different sizes and specifications can be used. In case cylindrical glass-fiber is used for the spacer elements, the circumference of each spacer elements is disposed with contacting the neighbor top and bottom layers as a respective interface of line-to-line contact.

If a relatively greater space between the image sensor chip 30 and the lens layer 32 is necessary, the size of the spacer elements 310 in the first bonding layer 31 may be relatively increased. Alternatively, an additional spacer layer may be sandwiched between two bonding layers to increase the space between the image sensor chip 30 and the lens layer 32, thereby controlling accurate focusing of the projected image onto the image capturing element 300. In the aforesaid first embodiment of the present invention, only one lens layer is used in the image sensor module. Alternatively, two or more lens layers may be installed with respective spacer layers sandwiched therebetween.

Figure 5:
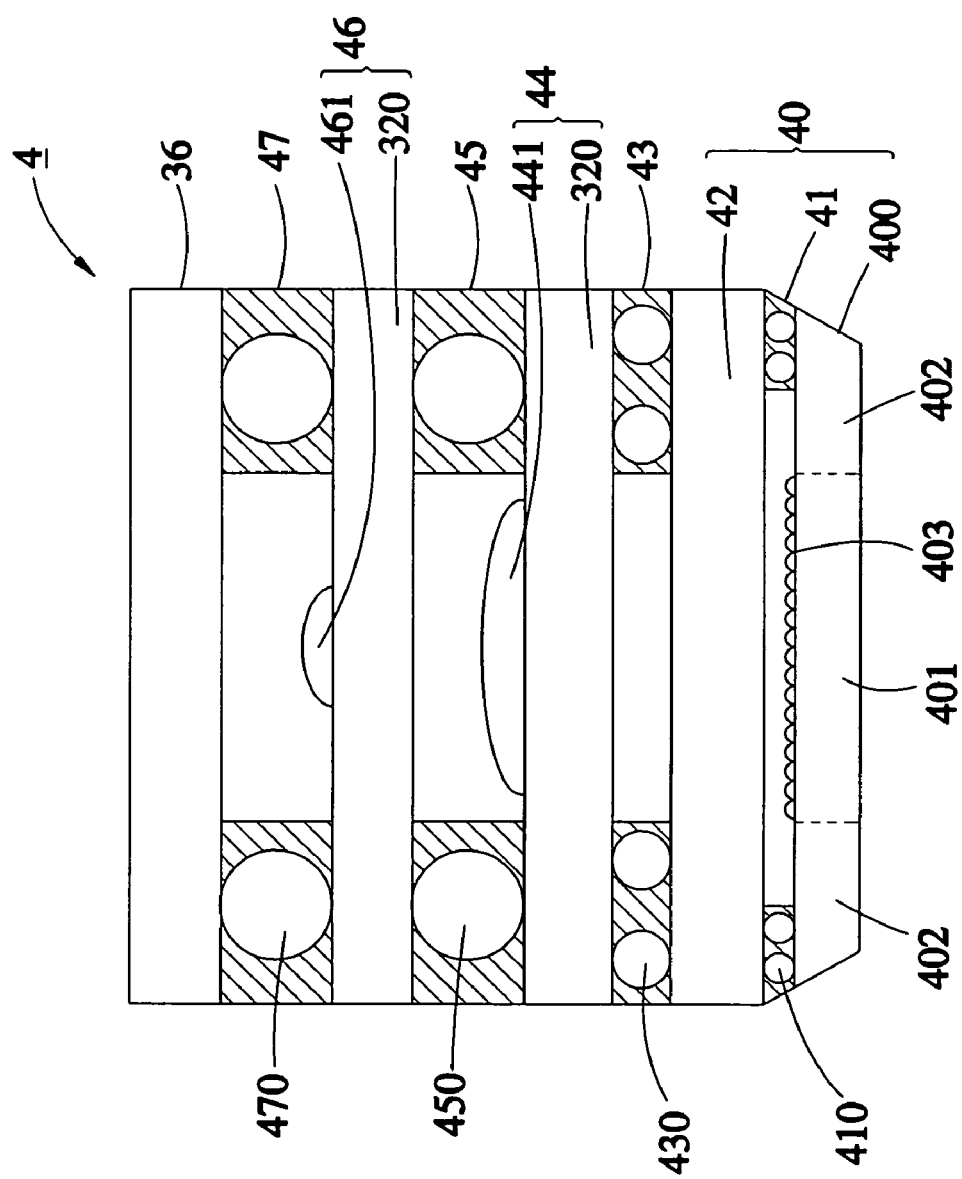
FIG. 5 is a schematic sectional view of an image sensor module in accordance with a second embodiment of the present invention.

Further, in the aforesaid first embodiment of the present invention, one spacer layer with two bonding layers are used to kept the lens layer and the top cover layer apart. Alternatively one single bonding layer may be used to substitute the arrangement of one spacer layer with two bonding layers. FIG. 5 shows an image sensor module 4 in accordance with a second embodiment of the present invention. According to this second embodiment, the image sensor module 4 comprises a chip module 40, a first lens layer 44 stacked on the chip module 40, a second lens layer 46 stacked on the first lens layer 44, a cover layer 36 stacked on the second lens layer 46, a first bonding layer 43 sandwiched between the chip module 40 and the first lens layer 44, a second bonding layer 45 sandwiched between the first lens layer 44 and the second lens layer 46, and a third bonding layer 47 sandwiched between the second lens layer 46 and the cover layer 36.

The chip module 40 comprises an image sensor chip 400, a bonding layer 41, and a transparent panel 42. The transparent panel 42 is pervious to light, and is bonded to the image sensor chip 400 by the bonding layer 41 to protect the circuit devices of the chip module 40 against environmental pollution. The image sensor chip 400 is manufactured by CIS technology, having an image capturing zone 401 and a partition zone 402. The image capturing zone 401 is surrounded by the partition zone 402 and having a micro lens array 403 manufactured thereon. The bonding layer 41 is bonded to the top surface of the partition zone 402. The micro lens array 403 accurately focuses an image projected by the first lens layer 44 and second lens layer 46 on the image capturing zone 401, projecting the image more effectively on the image sensor chip 400.

Each of the lens layers 44 and 46 has a transparent substrate 320 disposed with a lens 441 or 461 respectively thereon. The arrangement of the lens layers 44 and 46 optimizes the image sensor module 4 to have wide view angle and high picture quality.

The bonding layers 41, 43, 45 and 47 are arranged corresponding to the partition zone 402 of the image sensor chip 400, and provided with the respectively necessary thicknesses subject to the respective optical conditions of the lenses 403, 441 and 461. Same as the material properties of the bonding layer 31 of the aforesaid first embodiment of the present invention, each of the bonding layers 41, 43, 45 and 47 has a respectively predetermined size of spacer elements 410, 430, 450 or 470. The material and mixing density of the spacer elements 410, 430, 450 or 470 may be prepared in the same manner as the aforesaid first embodiment.

In the image sensor module 4 according to this second embodiment, the spacer elements 410, 430, 450 and 470 are respectively used to control the pitch between the chip module 40 and the transparent panel 42, the pitch between the transparent panel 42 and the first lens layer 44, the pitch between the first lens layer 44 and the second lens layer 46, and the pitch between the second lens layer 46 and the cover layer 36, thus eliminating the use of the spacer layer 34 in the aforesaid first embodiment or prior art design and saving the manufacturing time in glass material processing as cutting, grinding, etching, and etc. Especially to the multi-layer lenses manufacturing, the bonding layers 41, 43, 45 and 47 effectively enables the lenses 403, 441 and 461 to accurately focus the projected image onto the image sensor chip 400.

A prototype of image sensor module has been constructed with the features of FIGS. 4 and 5. The image sensor module functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An image sensor module comprising
    an image sensor chip, said image sensor chip having an image capturing zone and a partition zone surrounding said image capturing zone;
    at least one lens layer stacked on said image sensor chip, said lens layer having a transparent substrate and a lens mounted on said transparent substrate and adapted to project the image of an object onto said image capturing zone of said image sensor chip; and
    only one bonding layer arranged corresponding to said partition zone of said image sensor chip, said bonding layer comprising a glue agent and a plurality of spacer elements mixed in said glue agent, the height of said spacer elements being the height of the respective bonding layer, said only one bonding layer bonded between said image sensor chip and said at least one lens layer.

2. The image sensor module as claimed in claim 1, wherein said lens layer is deposed of a spacer layer made of a glass material having a predetermined thickness and corresponded to said partition zone of said image sensor chip.

3. The image sensor module as claimed in claim 2, wherein said spacer layer is bonded to the transparent substrate of said lens layer with said one bonding layer.

4. The image sensor module as claimed in claim 2, wherein said spacer layer is sandwiched between said image sensor chip and said at least one lens layer, having two opposite sides respectively bonded to said image sensor chip and to said at least one lens layer by said bonding layer.

5. The image sensor module as claimed in claim 1, further comprising an optical micro lens array arranged on said image sensor chip and working with said lens layer to focus the projected image of an object onto the image capturing zone of said image sensor chip.

6. The image sensor module as claimed in claim 5, further comprising a transparent panel arranged on said micro lens array, said transparent panel having two opposite sides respectively bonded to said image sensor chip and said at least one lens layer by said bonding layer.

7. The image sensor module as claimed in claim 1, wherein said at least one lens layer includes multiple lens layers stacked on said image sensor chip and bonded to one another by said bonding layer.

8. The image sensor module as claimed in claim 7, wherein the transparent substrates of each two adjacent lens layers of said multiple lens layers are bonded together by said bonding layer.

9. The image sensor module as claimed in claim 1, wherein the volume density of mixing the spacer elements and the glue agent of said bonding layer is at the respective ratio of within 1:10~1:100.

10. The image sensor module as claimed in claim 1, wherein the spacer elements of said bonding layer are spherical beads arranged in such a manner that the contact interface of each of said spacer elements with said image sensor chip and said at least one lens layer is respective a point-to-point contact.

11. The image sensor module as claimed in claim 1, wherein the spacer elements of said bonding layer are cylindrical glass-fiber members arranged in such a manner that the contact interface of each of said spacer elements with said image sensor chip and said at least one lens layer is respective a line-to-line contact.

12. The image sensor module as claimed in claim 1, wherein said spacer elements are selected from one of the materials of $SiO_2$, SiC, and polystyrene.

13. The image sensor module as claimed in claim 1, wherein said image sensor chip is manufactured by a SSIS (Solid State Image Sensor) technology of integrated circuit manufacturing.

14. An image sensor module comprising
    an image sensor chip, said image sensor chip having an image capturing zone and a partition zone surrounding said image capturing zone;
    a plurality of lens layers stacked on said image sensor chip, each of said lens layers having a transparent substrate and a lens mounted on said transparent substrate and adapted to project the image of an object onto said image capturing zone of said image sensor chip; and
    only one bonding layer arranged corresponding to said partition zone of said image sensor chip, said only one bonding layer comprising a glue agent and a plurality of spacer elements mixed in said glue agent, the height of said spacer elements being the height of the respective bonding layer, two of said lens layers bonded to each other by said only one bonding layer.

15. The image sensor module as claimed in claim 14, wherein said lens layer is deposed of a spacer layer made of a glass material having a predetermined thickness and corresponded to said partition zone of said image sensor chip.

16. The image sensor module as claimed in claim 15, wherein one of said spacer layers is bonded to the respective transparent substrate of said lens layer with said bonding layer.

17. The image sensor module as claimed in claim 15, wherein one of said spacer layers is sandwiched between said image sensor chip and the respective lens layer, having two opposite sides respectively bonded to said image sensor chip and to said lens layer by said bonding layer.

18. The image sensor module as claimed in claim 14, further comprising an optical micro lens array arranged on said image sensor chip and working with said lens layers to focus the projected image of an object onto the image capturing zone of said image sensor chip.

19. The image sensor module as claimed in claim 18, further comprising a transparent panel arranged on said micro lens array, said transparent panel having two opposite sides respectively bonded to said image sensor chip and to one of said lens layers by said bonding layer.

20. The image sensor module as claimed in claim 14, wherein said image sensor chip bonded with one of said lens layers by said bonding layer.

21. The image sensor module as claimed in claim 20, wherein the transparent substrates of each two adjacent lens layers of said lens layers are bonded together by said bonding layer.

22. The image sensor module as claimed in claim 14, wherein the volume density of mixing the spacer elements and the glue agent of said bonding layer is at the respective ratio of within 1:10~1:100.

23. The image sensor module as claimed in claim 14, wherein the spacer elements of said bonding layer are spherical beads arranged in such a manner that the contact interface of each of said spacer elements with said lens layer is respective a point-to-point contact.

24. The image sensor module as claimed in claim 14, wherein the spacer elements of said bonding layer are cylindrical glass-fiber members arranged in such a manner that the contact interface of each of said spacer elements with said lens layer is respective a line-to-line contact.

25. The image sensor module as claimed in claim 14, wherein said spacer elements are selected from one of the materials of $SiO_2$, SiC, and polystyrene.

26. The image sensor module as claimed in claim 14, wherein said image sensor chip is manufactured by a SSIS (Solid State Image Sensor) technology of integrated circuit manufacturing.

* * * * *